(12) United States Patent
Delprat et al.

(10) Patent No.: US 6,563,631 B2
(45) Date of Patent: May 13, 2003

(54) TUNABLE GAIN-CLAMPED SEMICONDUCTOR OPTICAL AMPLIFIER

(75) Inventors: Daniel Delprat, Vulanies/Seine (FR); Guilhem Alibert, Savigny sur Orge (FR)

(73) Assignee: Corning Incorporated, Corning, NY (US)

( * ) Notice: Subject to any disclaimer, the term of this patent is extended or adjusted under 35 U.S.C. 154(b) by 63 days.

(21) Appl. No.: 09/872,691

(22) Filed: May 31, 2001

(65) Prior Publication Data

US 2002/0067540 A1 Jun. 6, 2002

(30) Foreign Application Priority Data

Jul. 11, 2000 (EP) .............................. 00401992

(51) Int. Cl.⁷ ................................. H01S 3/00
(52) U.S. Cl. ...................................... 359/344
(58) Field of Search .......................... 359/344

(56) References Cited

U.S. PATENT DOCUMENTS

| | | | |
|---|---|---|---|
| 3,467,906 A | 9/1969 | Cornely et al | 330/4.3 |
| 4,790,634 A | 12/1988 | Miller et al. | 350/347 |
| 4,995,048 A | 2/1991 | Kuindersma et al. | 372/50 |
| 5,184,247 A | 2/1993 | Schimpe | 359/344 |
| 5,553,091 A | 9/1996 | Delorme | 375/50 |
| 5,568,311 A | 10/1996 | Matsumoto | 359/344 |
| 5,581,572 A | 12/1996 | Delorme et al. | 372/50 |
| 5,652,812 A | 7/1997 | Gurib et al. | 385/14 |
| 5,673,141 A | 9/1997 | Gambini | 359/341 |
| 5,699,468 A | 12/1997 | Farries et al. | 385/140 |
| 5,748,660 A | 5/1998 | Delorme et al. | 372/96 |
| 5,838,714 A | 11/1998 | Delorme | 372/96 |
| 5,892,781 A | 4/1999 | Pan | 372/6 |
| 5,894,492 A | 4/1999 | Welch et al. | 372/50 |
| 5,923,684 A | 7/1999 | DiGiovanni et al. | 372/6 |
| 5,926,493 A | 7/1999 | O'Brien et al. | 372/45 |
| 5,936,994 A | 8/1999 | Hong et al. | 372/96 |
| 5,991,068 A | 11/1999 | Massicott et al. | 359/337 |
| 6,025,939 A | 2/2000 | Lowenhar et al. | 359/34 |
| 6,058,125 A | 5/2000 | Thompson | 372/50 |
| 6,072,812 A | 6/2000 | Eng | 372/20 |
| 6,249,373 B1 | 6/2001 | Woodward | 359/344 |
| 6,339,496 B1 * | 1/2002 | Koley et al. | 359/344 |
| 6,347,104 B1 * | 2/2002 | Dijaili et al. | 330/250 |
| 6,356,685 B1 * | 3/2002 | Kim et al. | 359/33 |
| 6,445,495 B1 * | 9/2002 | Walker et al. | 359/344 |
| 2002/0057491 A * | 11/1999 | Dorgeuille et al. | 359/344 |

FOREIGN PATENT DOCUMENTS

EP 0 667 660 A1 11/1994 ........... H01S/3/103

OTHER PUBLICATIONS

High performance 1.55 um polarisation–insensitive semiconductor optical amplifier based on low tensile–strained bulk GaInAsp– Emery et al Electronics Letters Online No. 19970703 Apr. 9, 1997.

(List continued on next page.)

Primary Examiner—Thomas G. Black
Assistant Examiner—Deandra M. Hughes
(74) Attorney, Agent, or Firm—Juliana Agon

(57) ABSTRACT

A gain-tunable semiconductor optical amplifier (10) includes an amplifying section (38) for amplifying an optical signal (422). A first tunable reflector section (51) and a second tunable reflector section (52) are integrated on opposed sides of the amplifying section (38) to reflect the optical signal at a clamping wavelength and to change an internal gain level to cause a stimulated emission at the clamping wavelength above the internal gain level.

18 Claims, 9 Drawing Sheets

OTHER PUBLICATIONS

Gain–Clamped Semiconductor Optical Amplifier for 1.3um Wavelength with 20dB Polarization Independent Fiber-to-Fiber Gain and Significantly Reduce Pulse Shape and Intermodulation Distortions Holtman et al 21$^{st}$ Eur. Conf. On Opt. Comm. 1995.

"Noise Analysis of Conventional and Gain–Clamped Semiconductor Optical Amplifiers", Guilani, et al Journal of Lightwave Tech. vol. 18, No. 9 Sep. 2000.

"Clamped Gain Traveling Wave Semiconductor Optical Amplifier for Wavelength Division Multiplexing Applications", Doussiere, et al Alcatel Alsthom Recherche, Marcoussis France. 1994.

"Performance Analysis of Gain Clamped Semiconductor Optical Amplifiers Using Different Clamping Schemes", Zhao, et al. U. of MD Baltimore Country, Baltimore, MD 21250. 1997.

"Influence of the Involuntary Underetching on the Mechanical Properties of Tunable Fabry–Perot Filters for Optical Communications", Bondavalli, et al J. of Microelectromechanical Systems, vol. 10, No. 2, Jun. 2001.

* cited by examiner

TUNABLE GAIN-CLAMPED SEMICONDUCTOR OPTICAL AMPLIFIER

CROSS REFERENCE TO RELATED APPLICATION

This application claims the benefit of European Application No. 00401992.3, filed Jul. 11, 2000.

BACKGROUND OF THE INVENTION

1. Field of the Invention

The present invention relates generally to optical devices for optical communications, and particularly to a semiconductor optical amplifier (SOA) for use in optical communications.

2. Technical Background

Semiconductor optical amplifiers (SOAs) are optical devices of a structure essentially analogous to that of lasers and which are biased by an injection current or amplifying current ($I_{amp}$) below the threshold gain value ($g_{th}=g(I_{amp}^{th})$) when the amplifier gain or optical gain reaches the gain threshold:

$$g_{th}=\alpha-(1/L)\ln(r_1 \cdot r_2)=g(I_{amp}^{th}) \quad (1)$$

where $\alpha$ (alpha) equals the losses into the cavity or cavity losses, L is the cavity or device length and $r_1$ and $r_2$ are the facet reflectivities.

Hence, at a given or fixed wavelength, lasing appears as soon as losses are compensated by the material gain as equation 1 suggests. This gain threshold must not be reached to avoid starting of laser oscillations or the lasing effect. However, the SOA is biased above transparency, to exploit the amplification characteristics of the active material in the SOA.

Clamped Gain-SOAs (CG-SOAs) are a type of semiconductor optical amplifiers that have been developed for their benefit of improved input power dynamic range. This attribute enables the CG-SOA to be used as a fast switching optical gate in wavelength division multiplexing (WDM) systems because of the fast electrical control, optical bandwidth, and low intermodulation levels provided by the CG-SOAs. The CG-SOA is made based on the integration or hybridization of an active amplifying section together with one or two passive Bragg reflectors to make the reflectivities $r_1$ and/or $r_2$ sensitive to the wavelength. When laser oscillation begins, the gain of the CG-SOA is clamped or fixed to a given value $G_c$ with respect to the bias current. As a consequence, for a given bias beyond the laser threshold, gain compression arising with high input level does not appear until the amplifier available gain is higher than $G_c$. This provides a flat optical response over a large input power dynamic range or a wide range of input signal powers (at wavelengths other than the Bragg wavelength). The Bragg wavelength is forced out-of-band or out of the 3 dB optical bandwidth for the CG-SOA and the Bragg grating optical coupling efficiency for low reflectivity must be low in order to make the lasing operation only appear at a high injected current (in order to clamp the gain at a high level).

Basically for a Bragg grating, there is only one wavelength which is fixed for which a non-zero reflectivity value is realized. The Bragg wavelength for a Bragg reflector is given by:

$$\lambda_B=2n_{eff}\Lambda \quad (2)$$

where $\Lambda$ or $\lambda_A$ is the spatial period of the grating and $n_{eff}$ is the effective optical index of the guiding structure.

When the reflectivity is non-zero, there is a possibility to have a lasing operation at lambda$_B$ or $\lambda_B$, the Bragg wavelength, as soon as the amplifier gain is equal to the threshold gain. The gain increases with injected current, so a lasing operation occurs for a given injected current. Now if the injected current is still increased, the lasing effect increases while the ASE spectrum for different wavelengths of lambda$_B$ does not change. This means that for a wavelength different than lambda$_B$, the amplifier gain does not change if the injected current was increased. This is precisely the property of a Gain Clamped component, and this is more specifically, the well-known principle for the CG-SOA.

However, for some applications, the gain clamped to a given value can be a drawback. Once the optical gain is thus fixed, it can no longer be adjusted as would be desirable for use as a variable optical amplifier (VOA). If multiple CG-SOAs were to be used in an SOA array, it would be desirable to be able to easily vary the gain of an individual SOA in order to equalize the gain of the overall array. Therefore, there is a need for a tunable CG-SOA.

SUMMARY OF THE INVENTION

One aspect of the present invention is the teaching of a gain-tunable semiconductor optical amplifier comprising an amplifying section for amplifying an optical signal. A first tunable reflector section and a second tunable reflector section are integrated on opposed sides of the amplifying section to reflect the optical signal at a clamping wavelength.

In another aspect, the present invention includes a distributed Bragg reflector serving as the tunable reflector section.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE PREFERRED EMBODIMENTS

Figure 1:
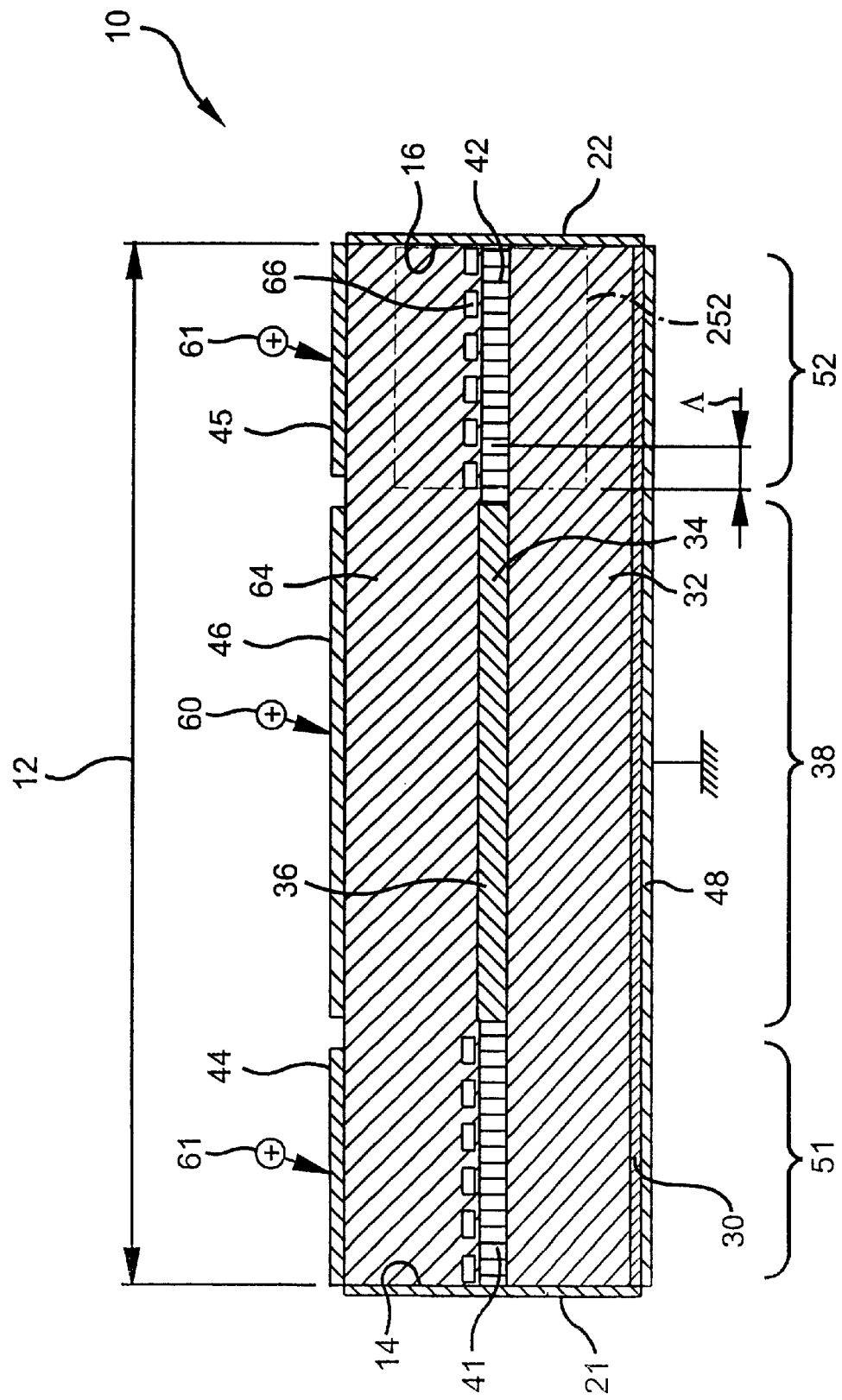
FIG. 1 is a cross-sectional view of a tunable CG-SOA 10, in accordance with the present invention.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of the semiconductor optical amplifier (SOA) as taught by the present invention is shown in FIG. 1, and is designated generally throughout by reference numeral 10.

In accordance with the invention, the present invention for the semiconductor optical amplifier 10 includes a distributed Bragg reflector (DBR) or DBR-laser-like body 12 having a first terminal facet 14 and a second terminal facet 16 for lasing. A first and second anti-reflection (AR) coating 21 and 22 having the same low reflectivity (preferably $10^{-3}$ or lower) are applied to the first and second terminal facets 14 and 16, respectively, to decrease reflectivities, for avoiding or limiting Fabry-Perot disturbances within the SOA operating range (As is known, the reflectivity is a ratio between the reflected power over the incoming power: $10^{-3}$ means that 1/1000 of the light is reflected back from the facet.) It is to be appreciated that other well known schemes like tilted active waveguides may be also use in combination with AR coatings to limit the residual reflectivity and are compatible with the present invention.

As embodied herein as one example as a common reference, the DBR laser 12 includes a semiconductor substrate 30. A bottom light confinement semiconductor layer 32, preferably made of an n-type or n-doped (N) Inp material but is not so limited, is deposited on top of the semiconductor substrate 30 to have its opposed ends form part of the first and second terminal facets 14 and 16. As is known, N-doped can be achieved with sulfer (S) or silicon (Si). A light guiding semiconductor layer 34 is deposited on top of the bottom light confinement layer 32 and its opposed ends form part of the first and second terminal facets 14 and 16. The light guiding layer 34 has an active part constituting a light amplifying medium 36 which defines an active part 38 of the amplifier 10. A first 41 and second 42 passive part of the light guiding layer is optically coupled to opposed ends of the active part of the guiding layer and defines a first 41 and second 42 passive part of the amplifier 10. In a purely indicative and in no way limiting, the amplifying medium 36 of the light guiding layer 34 is an InGaAsP intrinsic (I) material having a band gap energy equivalent wavelength of 1.55 μm. It is to be appreciated that the wavelength is not limited to a 1.55 μm system. Two other wavelengths of interest in today's telecom applications are 1.3 μm or 1.4 μm. For producing a lasing or oscillation wavelength of light normally at 1.55 μm in response to an amplifying current 60 biased into the amplifying part 38. While at the two ends of the light guiding layer 34, the passive guiding layer 41 and 42 is made of InGaAsP with a band gap wavelength less than 1.55 μm of a different composition of the same alloy.

A top light confinement semiconductor layer 64 is deposited on top of the light guiding layer 34 to have its opposed ends complete the formation of the first and second terminal facets 14 and 16. The top and bottom light confinement semiconductor layers 64 and 32 have opposite doping types and thus form a p-n junction. As an example, the top light confinement semiconductor layer 64 is preferably made of a p-type or p-doped (P) InP material. As is known, P-doping can be achieved with Zinc (Zn). The top light confinement semiconductor layer 64 has a pair of semiconductor tuning portions deposited on top of the first 51 and second 52 passive parts of the guiding layer and each tuning portion having a refractive index that varies in response to an electrical tuning actuation 61 applied to each of the pair of tuning portions and modifying the lasing operation produced by the amplifying medium 36.

Figure 2:
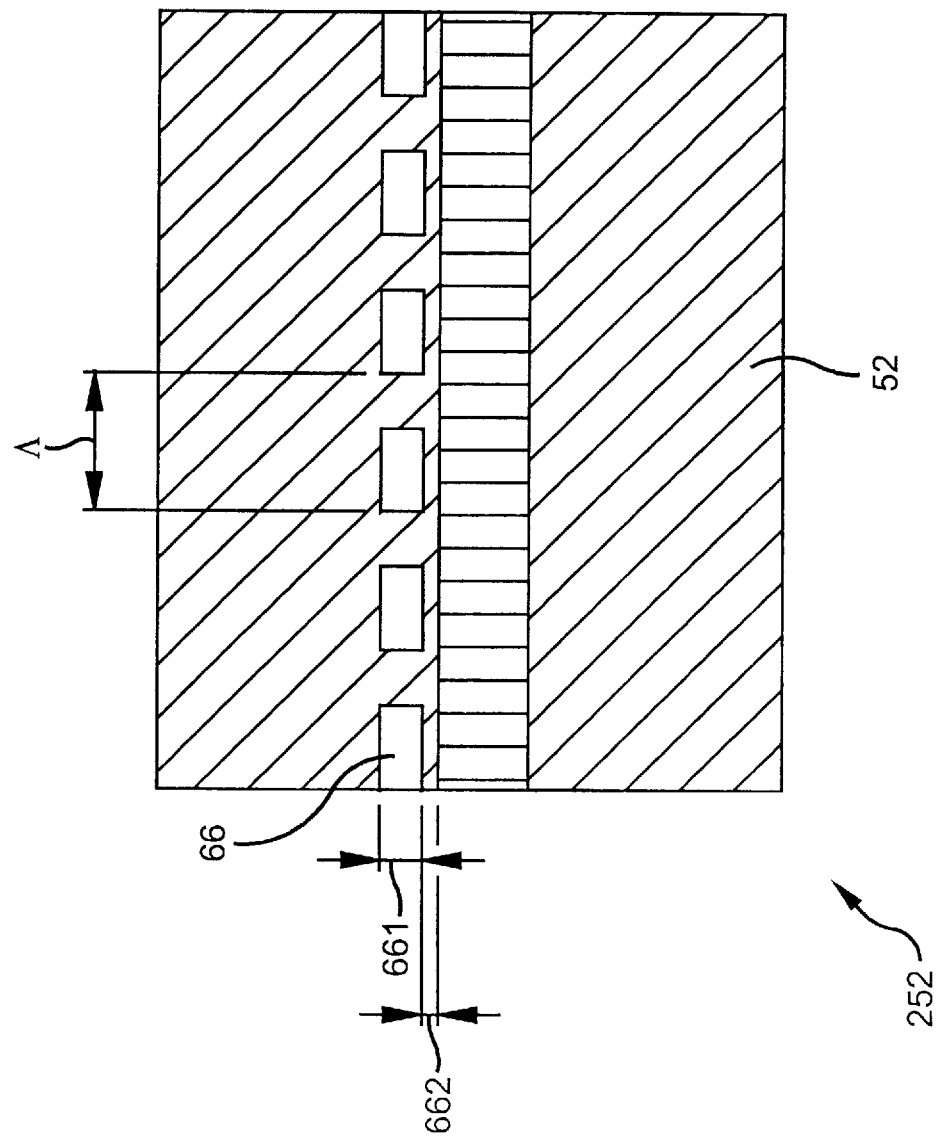
FIG. 2 is an enlarged view 252 of the passive part 52 of the amplifier 10 of FIG. 1, in accordance with the present invention.

FIG. 2 is an enlarged representation 252 of the passive parts 51 or 52 of the amplifier 10 of FIG. 1. Within each of the pair of tuning portions, a plurality of stripes 66 having a thickness 661 are disposed a gap distance 662 above the light guiding layer 34, thereby providing a periodic diffraction grating in a waveguide length direction of the amplifier 10 for providing gain-clamping by partially reflecting a stimulated emission of the amplifying part at the clamped wavelength.

In order to decrease the strength of the Bragg grating, different parameters can be changed, in relationship with each other. For example, the higher the gap is made, the lower the strength is. The thickness of stripes 66 can be changed as another example: the thinner the thickness is, the lower the Bragg grating strength is. The material of the stripes 66 are made of InGaAsP. If this composition is close to that of InP, the Bragg grating strength is low. Typically a quaternary alloy of 1.1 μm or 1.3 μm (bandgap) is chosen to provide the low reflectivity of the DBR sections.

Referring to FIG. 1, a pair of tuning electrodes 44 and 45 are in electrical contact with the pair of tuning portions for applying the electrical tuning actuation 61 to the plurality of stripes 66 so that the variation in electrical tuning actuation 61 can control an internal gain clamping of the active part of the amplifier 38.

For biasing the amplifying current 60 into the active part 38, a bias electrode 46 is in electrical contact with the top confinement layer 64 to cause the amplifying medium 36 to emit the radiation at a clamping wavelength outside the 3 dB optical bandwidth of the amplified spontaneous emission (ASE) of the active part 38, wherein the radiation is the amplified spontaneous emission below the gain clamping level and is the clamped ASE and the stimulated emission at the clampling wavelength above the gain clamping level.

A ground electrode 48 is in electrical contact with the substrate 30 such that the ground electrode commonly used with the bias 46 and tuning pair of electrodes 44 and 45 work together to provide the electrical actuation 61.

Figure 3:
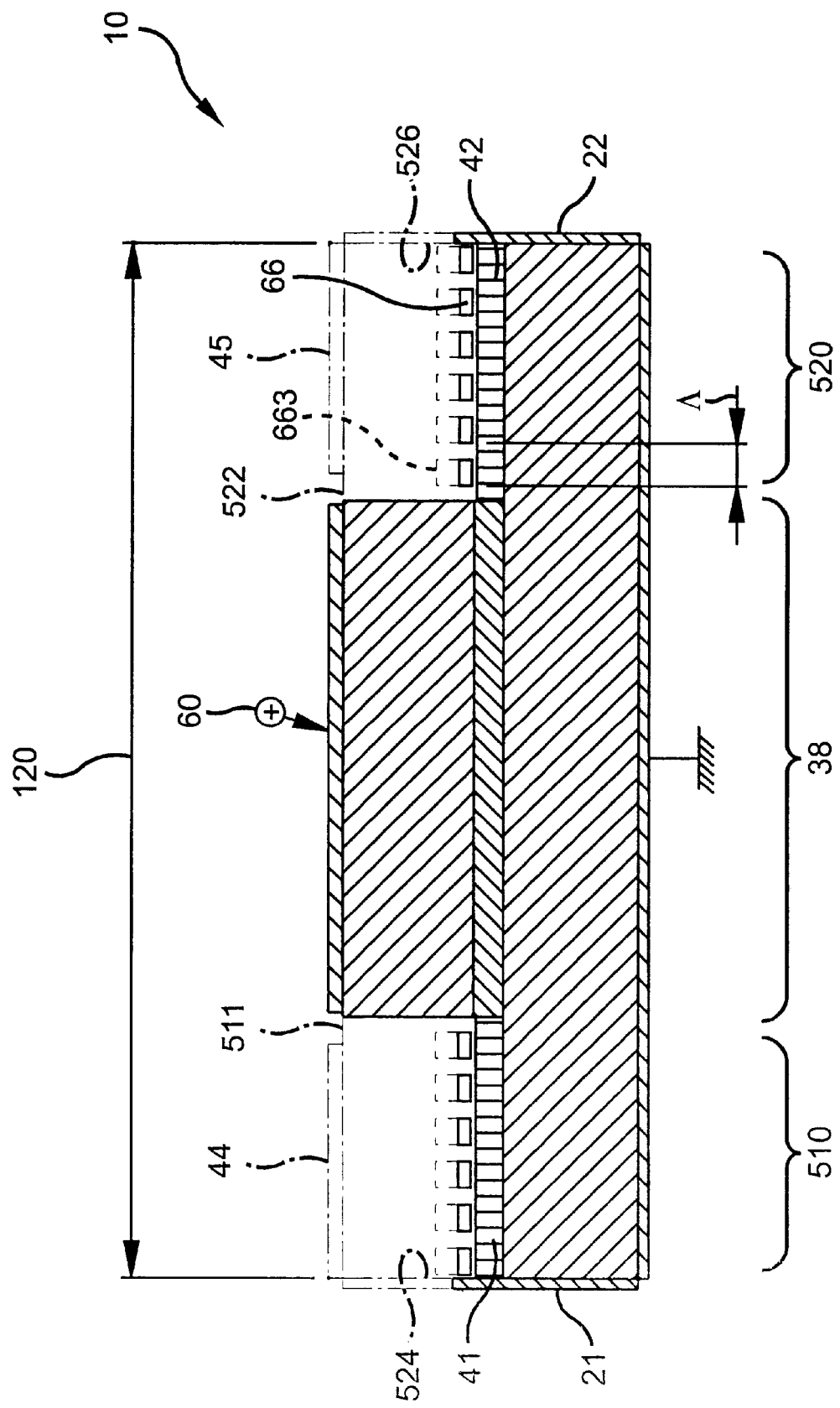
FIG. 3 is a composite view of parts of the amplifier 10 of FIG. 1, in accordance with the present invention.

FIG. 3 is a composite representation of FIG. 1, where common parts are carried forward by the same reference numbers, even though they may not be all called-out or referenced. When a reference number is not found at any time, refer back to the common reference of FIG. 1 and the enlarged portion of FIG. 2.

Another way of viewing the invention of the gain-tunable semiconductor optical amplifier 10 is to view the invention with its same composite layers first as a clamped gain semiconductor optical amplifier (CG-SOA) body portion 120 of FIG. 3 having an amplifying section for forming the active part of the amplifier 38, a first passive distributed Bragg reflector (DBR) section 510, and a second passive DBR section 520 on opposed sides of the amplifying section, each DBR sections 510 and 520 having stripes 66 disposed on top of the first and second passive parts of the light guiding layer 41 and 42 for clamping the internal gain of the active part 38 at the internal gain clamping level. A first p-doped confinement layer extender 511 (preferably integrated with the confinement layer of the amplifying section) is disposed on top of the first passive DBR section 41. The extender 511 is infused in between the stripes 66 and the first passive part of the guiding layer 41 to raise the stripes above the gap distance 662. The first p-doped confinement layer extender 511 further has the first tuning electrode 44 for applying the electrical actuation into the first passive DBR section 510 to form a first tunable reflector section or the first passive part of the amplifier 51. Likewise, a second p-doped confinement layer extender 522 (also preferably integrated with the confinement layer of the amplifying section as one continuous layer) is disposed on top of the second passive section 520 and infused in between the stripes 66 and the second passive part of the guiding layer 42 to raise the stripes 66 (dashed lines 663) above the gap distance 662, wherein the second confinement layer extender 522 has the second tuning electrode 45 for applying the electrical actuation into the second passive DBR section 520 to form a second reflector section or the second passive part of the amplifier 52. In accordance with the teachings of the present invention, the first and second confinement layer extenders 511 and 522 enable electrical actuation into the first and second DBR sections 510 and 520. To complete the extension, the first and second confinement layer extenders 511 and 522 preferably have their ends 524 and 526, extending the terminal facets 14 and 16, applied with the anti-reflection (AR) coatings.

Even though the tunable semiconductor optical amplifier of the present invention can be made starting with a CG-SOA first, for ease of manufacturing, the confinement layer of the extender 511 and 522 in the Bragg sections are integrated with the confinement layer of the amplifying section as the same layer. The confinement layer is preferably deposited uniformly during the same step. In the case of a conventional CG-SOA, the confinement layer is deposited every where and is then removed (or not deposited at all by masking) on top of the Bragg grating sections (in order to limit optical losses). Hence, the present invention teaches a CG-SOA without the conventional removal of the doped InP confinement layer in the DBR sections 510 and 520 to form the inventive optical amplifier 10 having an amplifying section or part 38, a first tunable reflector section or the first passive part 51; and a second tunable reflector section or the second passive part 52, wherein the first and second tunable reflector sections 51 and 52 are integrated on opposed sides of the amplifying section 38.

To simplify with a generic description of the present invention, without referring to CG-SOA or SOA parts, the previously mentioned elements can be renamed but retaining the same reference numbers of FIG. 1. Hence, the gain-tunable semiconductor optical amplifier 10 of FIG. 1 includes the amplifying section 38 for amplifying an optical signal or light path 422 of FIG. 4 or FIG. 5. The first tunable reflector section 51 and the second tunable reflector section 52 are integrated on opposed sides of the amplifying section 38. As part of each of the tunable reflector sections 51 or 52, more specifically a distributed Bragg reflector with certain elements contained within, at least one electrode 44 or 45 is disposed on top of the first light confinement layer 64 for forming the distributed Bragg reflector 51 or 52, such that the distributed Bragg reflector 51 or 52 has an effective optical index of the distributed Bragg reflector 51 or 52 and a given optical mode able to cooperate with the thin periodic layer (stripes 66 with confinement 64 sections in between), in order to produce an optical feedback into the amplifying section 38 at a clamping wavelength proportional to the physical period of the periodic layer and to the effective optical index of the distributed Bragg reflector 51 or 52.

Figure 4:
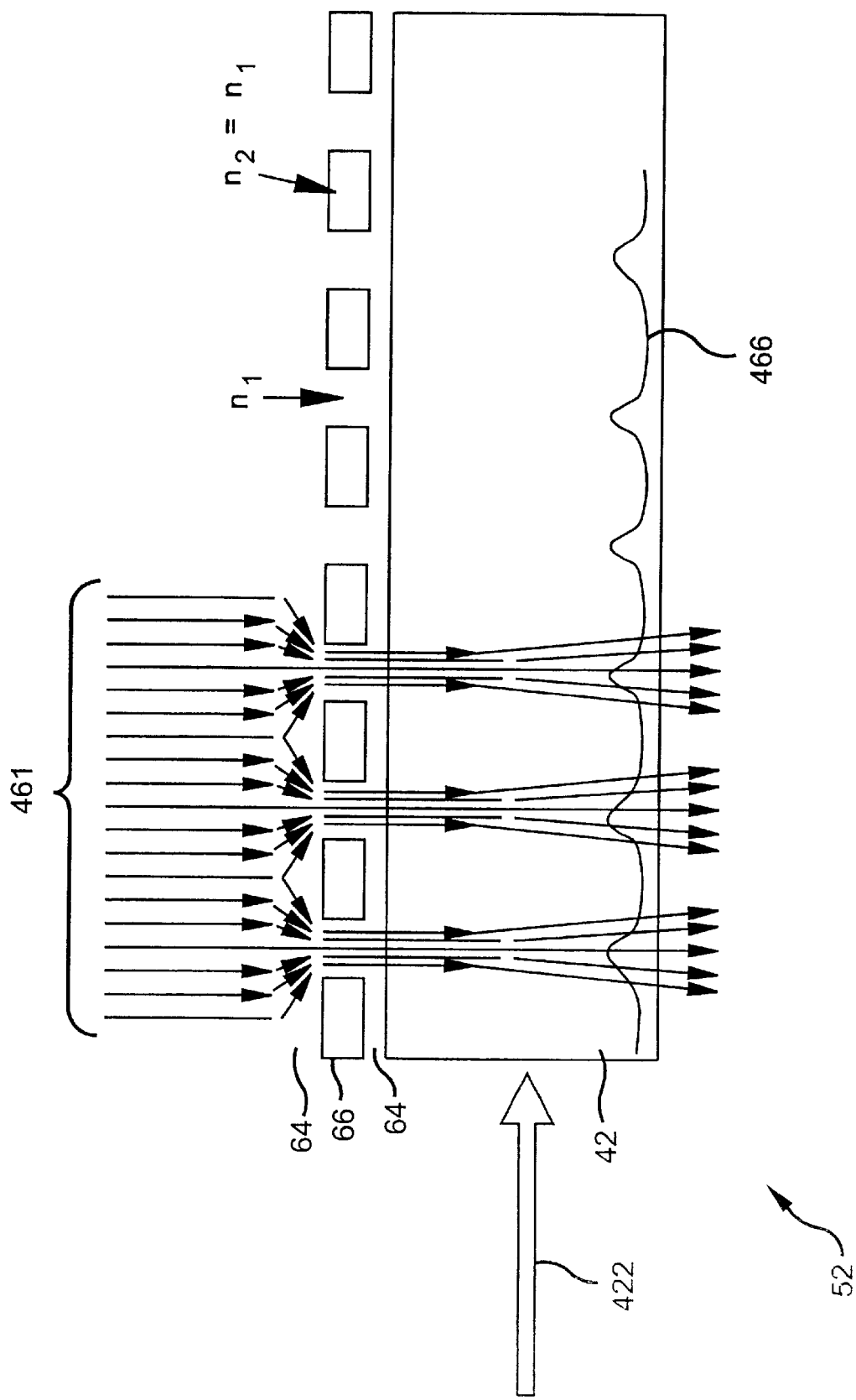
FIG. 4 is a diagrammatic depiction of an index fluctuation 466 due to a first embodiment of the periodic layer of stripes 66 within the confinement layer 64 of FIG. 1, in accordance with the present invention.

In a first distributed Bragg reflector embodiment of FIG. 4, showing an enlarged representative portion of the reflector 52 of FIG. 1, the same material, but with different doping, is used to form the periodic layer. The plurality of stripes 66 have a blocking doping and an optical index almost the same as the optical index of the confinement layer 64 where the stripes 66 are disposed within. In contrast, the confinement layer 64 has a non-blocking doping for providing the periodic arrangement made of the stripes 66 sections having blocking-doping and the confinement sections having non-blocking doping to form the periodic arrangement or layer able to spatially modulate the distribution of the charge carriers or the electric field in the light guiding semiconductor layer 41 or 42 contained in the distributed Bragg reflector 51 or 52, in response to the electrical activation 61, when an electric current 461 is injected into the p-n junction part relative to the distributed Bragg reflector or the p-n junction is reverse biased, so as to create, in the distributed Bragg reflector 51 or 52, a diffraction grating whose pitch spacing is equal to the period of the periodic arrangement. The impact of such a diffraction grating on the optical signal depends on the injected current 461 into the p-n junction. Hence, the optical feedback into the amplifying section 48 and the gain clamping level depends on the injected current into the p-n junction of the distributed Bragg reflector 51 or 52.

In FIG. 4, a representation of this first embodiment is shown with a specific example, but is not so limited. The stripes 66 are formed from an N-doped or semi-insulated (Fe doped) thin InP layer which is buried into the P-doped InP confinement layer 64 to provide the periodic diffraction grating periodically varying from being N or Fe doped to P-doped. As mentioned before, the material of the stripes 66 is the same as the material of the top confinement layer 64. Just the doping is different. The doping is an element which makes the electrical properties of the material different. As is known, one can make N-doped (with S or Si), P-doped (with Zn) or semi-insulating (non conductive with Fe). The resulting grating from the stripes 66 interpersed with the top confinement layer 64 is made of Fe doped InP and P-doped InP, respectively. The iron (Fe) in the stripes 66, will make the stripes 66 non conductive, to block the tuning current of the electrical actuation affecting current injection into the P-I-N structure of the passive parts of the amplifier 51 and 52.

Hence, different dopings in the same material is one way to achieve the desired grating. Specifically, in one example, to have p-doped InP, as the top confinement layer 64, with n-doped InP as the first or same material of the stripes 66. Consequentely, for the whole stack (including the confinement layers 64 and 32) in the passive parts of the amplifier 51 and 52, there will be P-I-N sections (through the non-stripes sections of the top confinement layer) and P-N-P-I-N sections (through the stripes sections of the top confinement layer), respectively, where the n-p junction (through the stripes 66) is also blocking the tuning current of the electrical actuation 61.

Because the indexes between the stripes 66 and the top confinement layer is almost the same where $n_1 \approx n_2$, when no current is injected, there is no grating formed, or at least the residual reflectivity is not strong enough to allow the lasing condition of equation 1. The grating appears only when a tuning current is injected due to the electrical actuation 61. Without a tuning current injected into the Bragg grating section 51 or 52, the SOA gain is not limited by the lasing threshold of equation 1 due to the anti-reflection coatings 21 and 22 applied on both facets to reduce the reflectivities.

FIG. 4 is thus a representation of the index change in response to the existence of an electrical actuation. The SOA 10 is not clamped when no current, from the electrical actuation 61, is injected into the Bragg grating section 52. The Bragg grating section 52 is electrically activated when the electrical distribution into the active section 42 is disturbed by the upper grating 66 and the confinement 64 sections which leads to a refractive index variation 466 into the core layer 42. This index fluctuation (i.e. a Bragg grating) 466 then permeates into the core layer 42 to change reflectivity of the Bragg sections 51 and 52.

Figure 5:
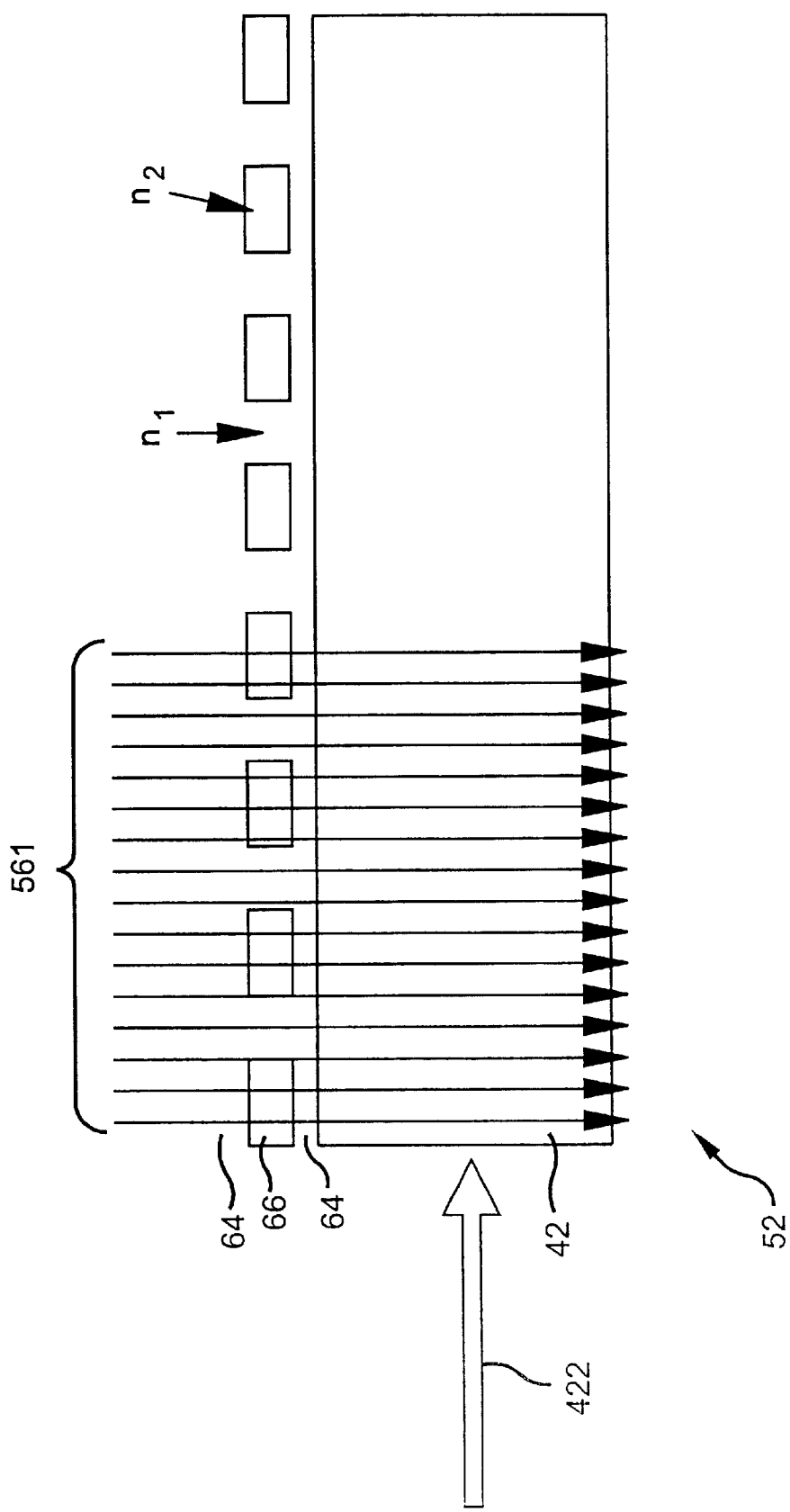
FIG. 5 is a diagrammatic depiction of a global index variation 566 due to a second embodiment of the periodic layer of stripes 66 within the confinement layer 64 of FIG. 1, in accordance with the present invention.

In a second distributed Bragg reflector embodiment of FIG. 5, different materials are used to form the periodic layer. Using different materials to have different optical indexes to affect the overall composite effective optical index, the plurality of stripes 66 have an optical index different than the optical index of the confinement layer 64 where the stripes 66 are disposed within. Hence, a periodic arrangement is formed with the stripes 66 sections and the confinement 64 sections with different optical indexes to form a Bragg grating layer with a given Bragg grating period as the physical period and the different optical indexes for modifying the effective optical index.

At least one electrode 44 or 45 of FIG. 1 allows the tuning current, as one form of the electrical actuation 61, to be injected into the p-n junction for varying the effective optical index of the distributed Bragg reflector 51 or 52, in response to the tuning current. Thus, the tuning current is able to modify the clamping wavelength and the gain clamping level, in accordance with the wavelength dependence of the amplified spontaneous emission (ASE) of the amplifying section in a window outside (beyond or before) the 3 dB optical bandwidth of the amplifying section 38, due to the pair of distributed Bragg reflectors 51 and 52 having the given optical mode able to cooperate with the Bragg grating layer, in order to produce the optical feedback into the amplifying section 38 at the clamping wavelength proportional to the given Bragg grating period and to the effective optical index of the distributed Bragg reflector 51 or 52.

The Bragg grating strength, depending on the thickness 661 and gap 662 values of FIG. 2 and on the refractive index of stripes 66, is designed such a way that the laser operation (stimulated emission) appears only at a high internal gain clamping level.

Referring to FIGS. 1, 2, and 5, the second material for making the Bragg grating is a quarternary alloy made of InGaAsP (Indium Gallium Arsenic Phosphore) to differentiate the indexes between the top confinement layer 64 and the stripes 66 such that $n_1$ is not the same as $n_2$. In general, the composite materials for making SOAs or lasers in the 1.55 μm band of interest for optical communication is known. This kind of SOA or laser device is made on InP substrates 30.

The substrate or wafer 30 is doped with Sulfer. Preferably, the wafer is diced and polished from a mono-crystal with a shape of a rod. Because, the wafer surface contains some defects, a buffer layer or the bottom confinement layer 32 is added by epitaxial growth. The material to build the stack or the P-I-N structure begins with the top and bottom InP confinement layers 64 and 34 and the alloy In(1−x)Ga(x)As(y)P(1−y) sandwiched in between the confinement layers 64 and 34. The symbols x and y represent the amount of Ga and As contained within the alloy, added to the InP to modify the bandgap and the optical index of the alloy. Hence, the index and the bandgap of the alloy also depend on x and y.

The present invention will be further clarified by a table of this second example which is intended to be exemplary of the invention.

Example 2

As an example, the alloys used for the GC-SOA are as follows:

| Layers of Stack | x,y | Bandgap | Optical Index at 1550 nm |
|---|---|---|---|
| Confinement layers 64 and 32 (P and N-doped) | 0,0 | 0.9 μm | 3.16 |
| Bragg material for stripes 66 | 0.15,0.33 | 1.1 μm | 3.28 |
| Light guiding layer 34 (or amplifying core layer) | 0.41,0.89 | 1.55 μm | 3.6 |

As can be seen in this example, the optical index increases with the bandgap energy of the alloy. Usually, a material is not described with respect to x and y proportions, but with respect to its bandgap energy. So the InGaAsP layers are denoted with a bandgap energy corresponding to a wavelength of 1.55 μm or 0.9 μm or 1.1 μm. For the InP substrate 30, the bandgap is not specified since the bandgap is fixed.

Referring to FIG. 5, the SOA 10 is always clamped even when no current is injected into the Bragg grating section 51 or 52. In this embodiment, the Bragg grating formed is physical, made of two materials with a different refractive index. When a current 561 is injected, from the electrical actuation 61, the refractive index of the core guiding structure 41 or 42 is globally modified and then the Bragg wavelength is modified per equation 2.

It will be apparent to those of ordinary skill in the pertinent art that modifications and variations can be made to the stripes 66 or the electrical actuation 61 to create different actual or virtual gratings, responding to different types of stimuli to provide the tunable clamping effect.

A tunable-clamp gain SOA 10 is thus taught by and the result of the present invention. The tunable-clamp gain SOA 10 is achieved by the combined use of the DBR laser principle (tunability) with the use of the clamped-gain SOA principle. DBR lasers and conventional clamped gain-semiconductor optical amplifiers (CG-SOAs) are already known, but their combination is not known to provide the unexpected result of a CG-SOA that is tunable.

From the structural point of view, the inventive tunable CG-SOA 10 differs from a simple DBR laser for two reasons. First, the coupling efficiency of the Bragg grating with the light path, optical wave, or optical signal 422 of FIGS. 4 and 5 is low, i.e. the reflectivity, coupling strength, or the Bragg grating strength for the tunable CG-SOA 10 of FIG. 1 is lower than for a DBR laser. Second, the Bragg wavelength is fixed by design out of the 3 dB optical bandwidth, as in a conventional CG-SOA.

In contrast with a DBR laser application, the principle to obtain tunability in the inventive tunable CG-SOA is not used for tuning the wavelength of a DBR laser. Nevertheless, from the DBR point of view, the wavelength used in the inventive tunable CG-SOA 10 of FIG. 1 for the laser emission is out of the 3 dB bandwidth of the amplifying section material 36, as the similar principle for the achievement of a Clamped Gain SOA (CG-SOA).

In the case of any CG-SOA, including the inventive tunable CG-SOA 10, the Bragg wavelength is out of the 3 dB optical bandwidth of the amplifier 38 and the Bragg grating coupling efficiency must be low in order to make the lasing operation appear at a high injected current (to clamp the gain at a high level).

There is no need of p-doped InP in the Bragg section in a conventional CG-SOA body portion 120 of FIG. 3. The Bragg reflector 510 or 520 of a conventional CG-SOA is passive, which means that if the Bragg reflector or grating section 510 or 520 of the conventional CG-SOA is integrated with an active section 38, the Bragg grating section 510 or 520 would still be made of non-doped material. P-doping, as discussed, is usually required to inject current (to get a p-i-n junction), which is not needed for the passive grating 510 or 520 of the conventional CG-SOA. Moreover p-doped InP has quite a large absorption coefficient so conventional CG-SOAs have structures without a p-doped material. In the case of the inventive tunable CG-SOA 10, the Bragg grating section 51 or 52 is made of a p-i-n junction and one can inject some current or apply an electric field, as known forms of the electrical actuation 61, unlike the passive Bragg reflector 510 or 520 in a conventional CG-SOA. Hence, from a structural point of view, the Bragg grating section 51 or 52 is active in the inventive tunable CG-SOA 10 unlike the passive grating section 510 or 520 of the conventional CG-SOA.

Additionally, lasing is not wanted for a conventional SOA. For lasing not to happen, $r_1$ and $r_2$ of equation 1 are made as low as possible by applying AR coatings 21 and 22 on the facets in order to make the gain threshold ($g_{th}$) of equation 1 very high in FIG. 1. In the case of a conventional Clamped Gain SOA (CG-SOA), two passive Bragg grating sections 510 and 520 are added on each side of the amplifier section 38 in order to make the reflectivities $r_1$ and $r_2$ sensitive to the wavelength. Basically for a Bragg grating, there is only one wavelength as seen in equation 2 for which a non-zero reflectivity value is realized. When the reflectivity is non-zero, there is a possibility to have a lasing operation at lambda$_B$ as soon as the amplifier gain is equal to the threshold gain. The gain increases with injected current, so a lasing operation occurs for a given injected current. Now if the injected current is still increased, the lasing effect increases while the ASE spectrum for different wavelengths of lambda$_B$ does not change. This means that for a wavelength different than lambda$_B$, the amplifier gain does not change if the injected current was increased. This is precisely the property of a Gain Clamped component, and this is more specifically, the well-known principle for the CG-SOA.

Now if the lambda$_B$ (passing from lambda$_{B1}$ to lambda$_{B2}$) value was changed, lasing will occur for a different injected current. Because the gain of the amplifier depends on the wavelength, lasing operates at a different injected current (since the gain for a given injected current at lambda$_{B1}$ is different than at lambda$_{B2}$). This means that the clamping thresholds for lambda$_{B1}$ and lambda$_{B2}$ are different. The way to adjust lambda$_B$ in the inventive tunable CG-SOA 10 of FIG. 1, 4 or 5 is to inject current providing a variable current density (or apply an electric field for providing a variable field density) to the Bragg grating section 51 or 52 (similar to the way done in a DBR laser).

On the other hand, in a DBR laser application, the Bragg wavelength (lambda$_B$) is in the 3 dB optical bandwidth of the amplifier, and the Bragg grating is designed in such a way that it has a high coupling coefficient with the optical wave to achieve the laser effect. In other words, a high coupling coefficient means that the Bragg grating reflectivity ($r_1$, or $r_2$ of equation 1) is quite high. The high reflectivity allows the desired lasing threshold current to be low in order to achieve the laser effect.

In accordance with the teachings of the invention, the details of the subcomponent parts (such as the p-i-n junction) between the DBR laser and the inventive tunable CG-SOA 10 are different. Referring to FIGS. 1 and 2, for highlighted details of the differences, arrows show where the current or electric field from the electrical actuation 61 is connected to make the Bragg grating section 51 or 52 active in either the DBR laser or the inventive tunable CG-SOA. For example, current injections into the active 38 and Bragg sections 51 and 52 are represented by arrows toward the component electrical pads 46, 44, and 45, respectively. These representations show an example of how to make the inventive optical device. As one example, a buried ridge stripe structure (BRS) is used to get the lateral electrical confinement, with proton implantation on both sides of the active 38 and Bragg sections 51 and 52 (to provide electrical conduction in the upper confinement layer material 64) to concentrate the current injection towards the core guiding layer 41 or 42.

Figure 8:
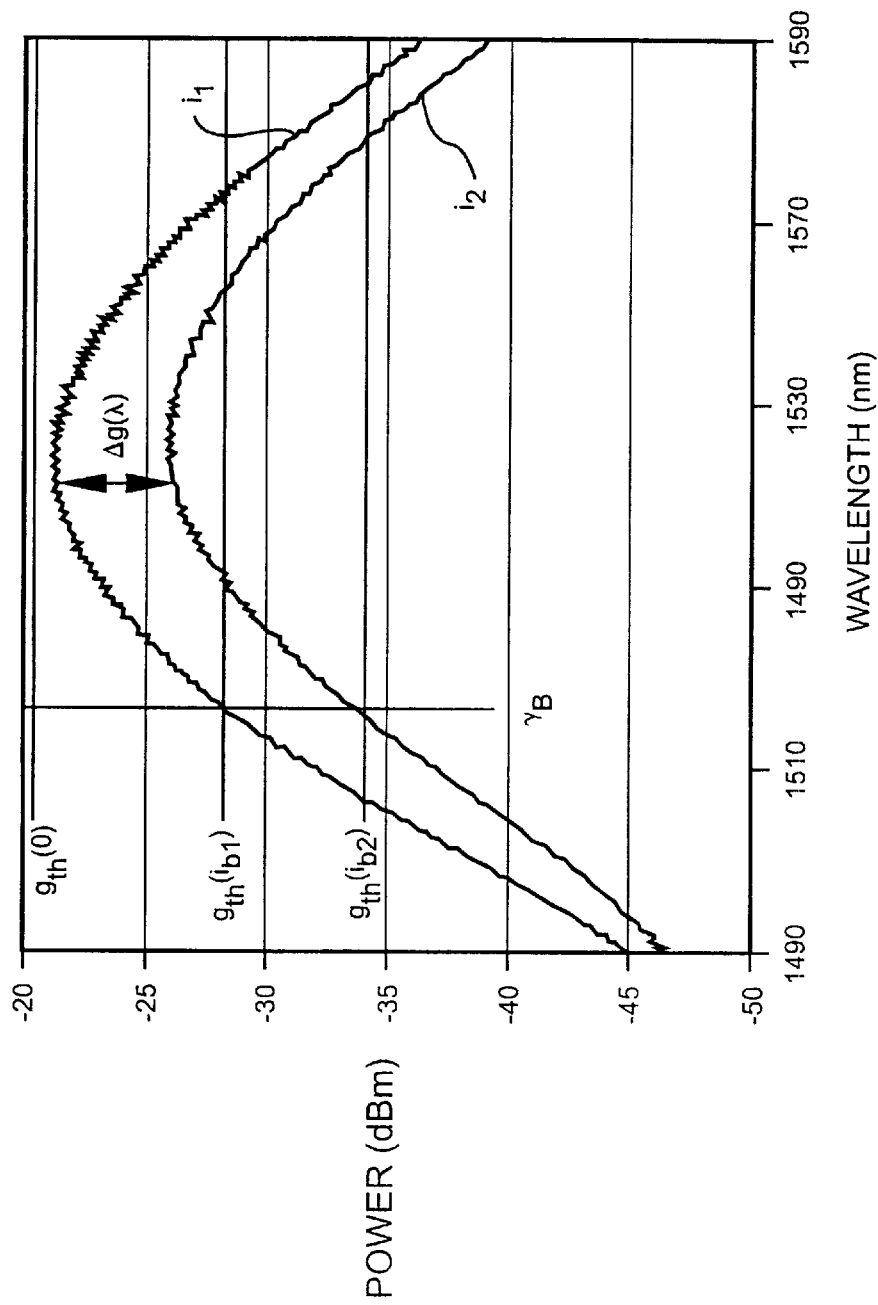
FIG. 8 is a similar chart of FIG. 6 modified by the effects of the first embodiment of the invention of FIG. 4, in accordance with the present invention.

Wavelength tuning of the Bragg wavelength is obtained by current injection in the p-i-n junction where an index Bragg grating has been formed on top of a guiding structures such that the Bragg wavelength of eq. 2 can be achieved. The current injection leads to a variation of the effective index which then leads to a Bragg wavelength variation. As with a DBR laser, a wavelength tunability of between 10 to 17 nanometers (nm) can be achieved with the Bragg reflectors as seen in FIG. 8.

Referring to the tunable CG-SOA 10, a pair of Bragg grating reflectors 51 and 52 are formed in the passive waveguide, on both sides of the amplifying section 38. The driving current or the injection current I$_{amp}$ 60 is injected into the amplifying section 38 while the same tuning current, as one form of the electrical actuation 61, is injected in the first and second Bragg grating sections or reflectors 51 and 52. More precisely, the current density has to be the same, if not using the same tuning current. When the two DBR sections 51 and 52 have the same length, the current density will be the same. The current density has to be equalized in order to equalize the Bragg wavelength of the two DBR sections 51 and 52. As is known, the Bragg wavelength is proportional to the effective optical index, which is related to the current density. If the current is not equalized, the SOA could be forced to lase at two different wavelengths. Physically, one wavelength would lase before the other one, and this would imply that one DBR reflector is not used. In practice, the current density can be simply equalized by providing a short cut of the electrical line on top of the two DBR sections 51 and 52.

On the surface, a conventional DBR laser and the tunable clamp gain SOA of the present invention is similar structurally, even if their operation is different. To zoom in on the structural difference, the details of the Bragg grating section 51 or 52 of FIGS. 1 and 2 have to be appreciated.

For either the DBR laser or the inventive tunable CG-SOA 10, the Bragg grating section 51 or 52 is a p-i-n junction, as noted before, (where p-i-n, case insensitive, means that the upper layer 64 is doped p, the guiding section 41 or 42 is intrinsic and the lower confinement layer 32 is n-doped).

According to the teachings of the present invention, the period of the Bragg grating in the tunable clamp gain SOA is made differently than the period of a conventional DBR laser in order to obtain the Bragg wavelength out-of-band for the tunable CG-SOA when the Bragg wavelength is usually made in-band for the DBR laser. The Bragg grating thickness 661 and its gap 662 from the core guiding layer 41 or 42 are also different between the DBR laser and the inventive tunable CG-SOA 10 in order to obtain a low reflectivity for the tunable CG-SOA 10, while the reflectivity is usually quite high for a DBR laser.

It is to be noted that the present invention teaches a gain clamping change with a changing lasing condition. The tunability of the gain of the SOA 10 is provided by a wavelength change (according to the second embodiment of FIG. 5) or to a Bragg grating reflectivity change (according to the first embodiment of FIG. 4) which affects the gain threshold conditions.

Figure 6:
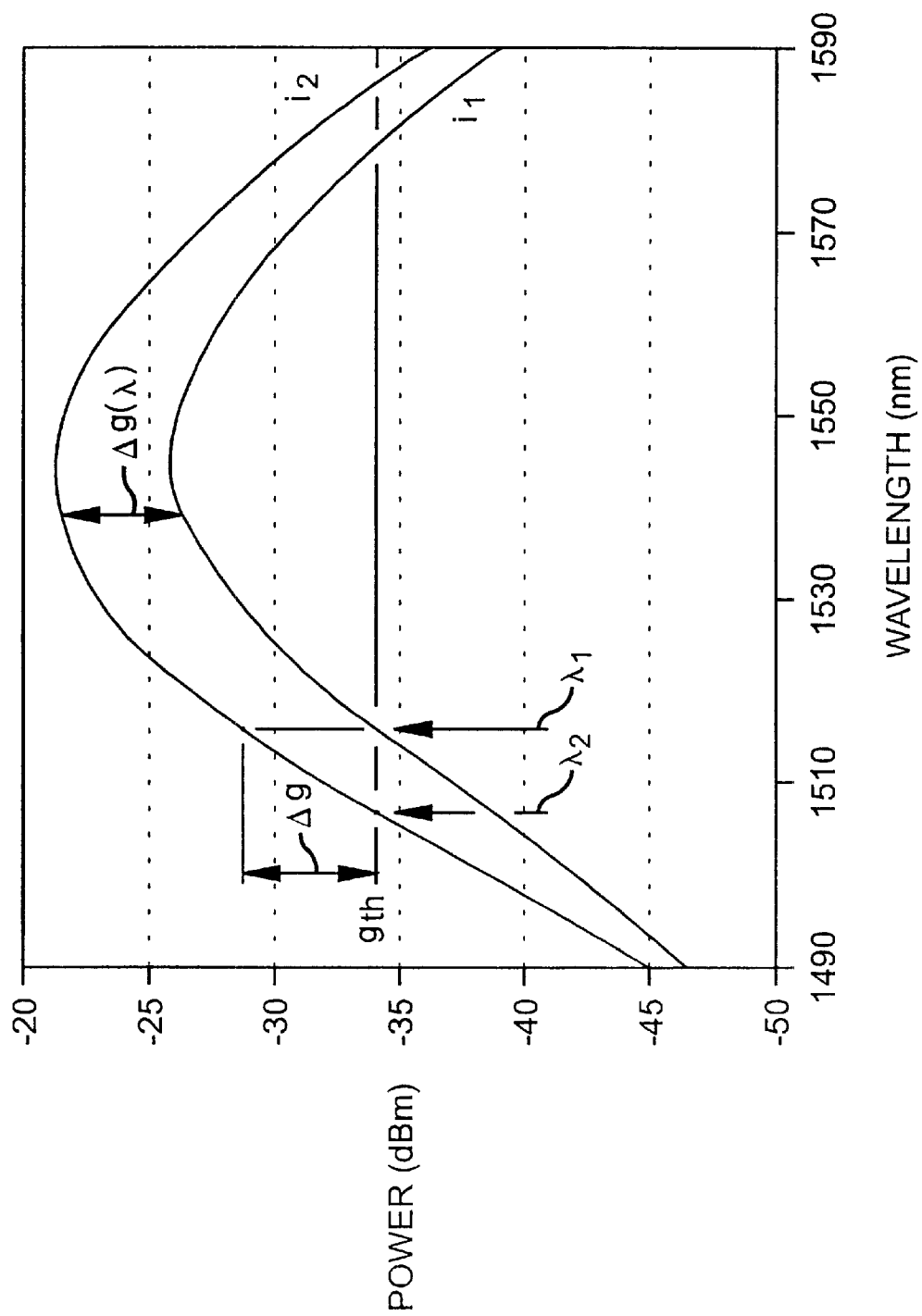
FIG. 6 is a chart showing the variation of power as a function of wavelength, with a gain change also as a function of wavelength, in accordance with the present invention.

The gain versus wavelength of a semiconductor optical amplifier (SOA) for a given current injected into it is represented by the amplified spontaneous emission (ASE) spectrum (as shown in FIG. 6) at two different amplifying currents.

A lasing effect occurs when the amplifier gain reaches a threshold gain value as given in equation 1, giving the reflectivity of a Bragg grating with respect to the refractive index $n_1$ and $n_2$.

In accordance with the second embodiment of FIG. 5, this relationship is changed to include a dependence on the Bragg wavelength in the following revised equation 1a:

$$g(\lambda_B, I_{amp}^{th}) = \alpha - (1/L)ln(r^2) = g_{th} \quad (1a)$$

When the wavelength $\lambda$ does not equal the Bragg wavelength and the amplifying current injected or biased in the amplifying section 38 becomes higher than the threshold current, $I_{amp}^{th}$, the gain becomes fixed or clamped at $g(\lambda, I_{amp}^{th})$.

Referring to this power versus wavelength graph (varying ASE) of FIG. 6, relating to equation 1a, and according to the slope of the gain spectrum of the amplifying section 38 in the area of the curve where DBR laser operation is desired (outside the 3 dB optical bandwidth), a variation of the Bragg wavelength, by current injection of the tuning current $I_{Bragg}$ into each of the first and second Bragg reflector sections 51 and 52, will be translated into a variation of the lasing threshold ($\Delta g$). Referring to FIG. 6, the slope of the gain or ASE spectrum of a SOA is about 0.55 dB/nm at a wavelength of about 1510 nm (Bragg wavelength) and about −0.49 dB/nm at a wavelength of about 1580 nm (Bragg wavelength outside the 3 dB window usually centered around a wavelength of about 1550 nm).

The Bragg reflectivity is thus changed or tuned at two different center or Bragg wavelengths $\lambda_1$ and $\lambda_2$ which are substituted for $\lambda_B$ in equation 1a to arrive at the following relationship:

$$g_{th} = g(\lambda_1, i_1) = g(\lambda_2, i_2) = g(\lambda_1, i_2) - \Delta g$$

where $i_1$ and $i_2$ are the threshold currents at the center wavelengths or the Bragg wavelengths, respectively.

Figure 7:
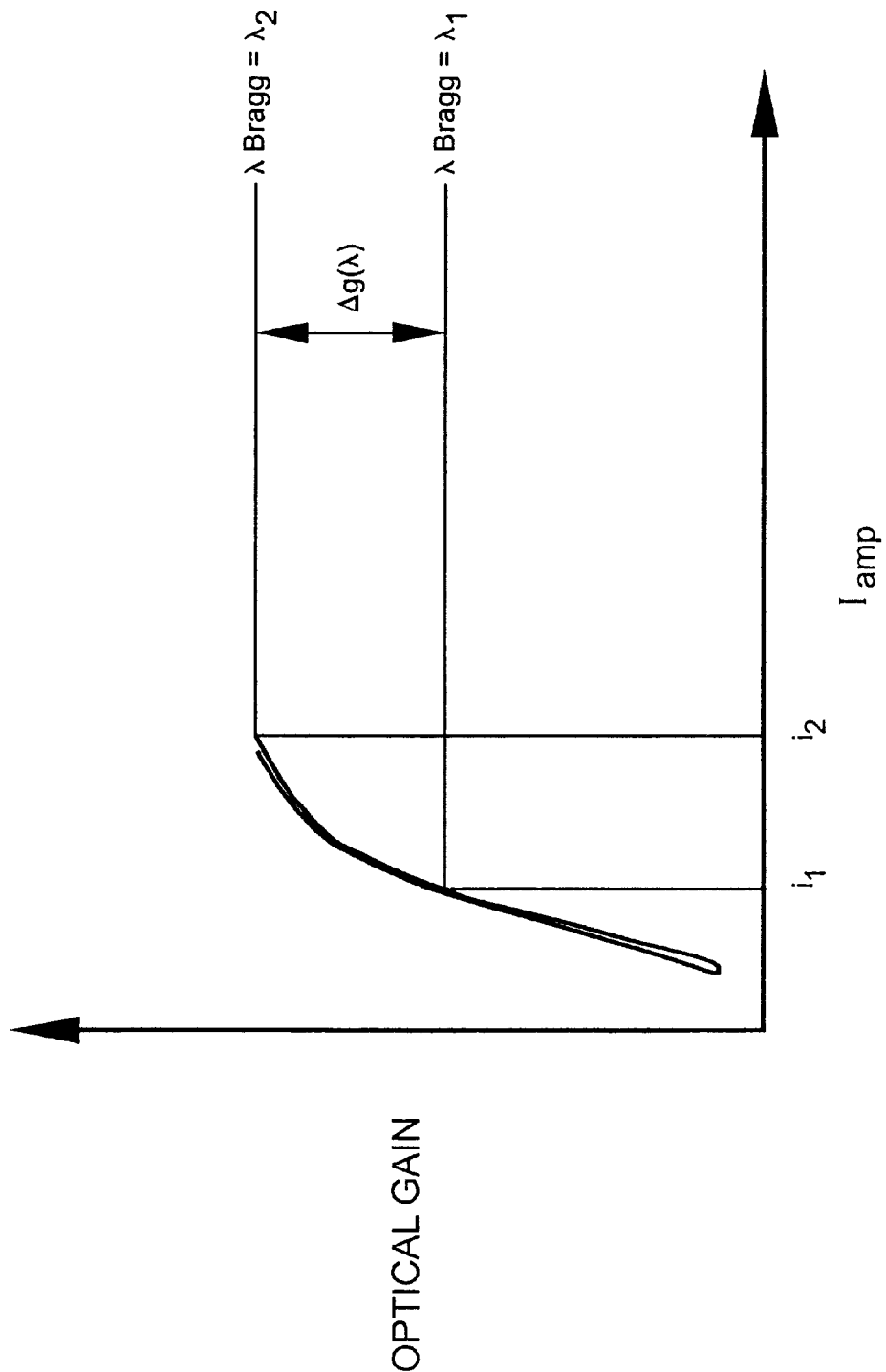
FIG. 7 is a chart showing the variation of gain tunable or fixed, as a function of the amplifying current 60 of FIG. 1, in accordance with the present invention.

As a result and referring to the gain curves of FIG. 7, the gain is clamped as a function of the tuning or Bragg current and the Bragg wavelengths. Hence, for the second embodiment of FIG. 5, at a given Bragg wavelength $\lambda$, the tunable SOA gain is clamped at $g(\lambda, i_1)$ when the Bragg wavelength is $\lambda_1$. Likewise, the tunable SOA gain is clamped at $g(\lambda, i_1) + \Delta g(\lambda)$ when the Bragg wavelength is $\lambda_2$. Assuming a tuning range of 17 nm and the gain function $\Delta g(\lambda)$ does not vary a lot with wavelength $\lambda$, a maximum gain variation of 9.3 dB and 8.3 dB can be achieved if the tunable SOA was clamped around 1510 nm and 1580 nm, respectively. Hence, a gain adjustment of several dB's can be made, which is large enough for the equalization of a SOA gate array, for example.

In accordance with the first embodiment of FIG. 4, equation 1 is changed to include a dependence on the Bragg reflectivity in the following revised eq. 1b:

$$g(I_{amp}^{th}) = \alpha - (1/L)ln(r(I_{Bragg})^2) = g_{th}(I_{Bragg}) \quad (1b)$$

When no current is injected into the Bragg section, a minimal optical feedback into the amplifying section is obtained, limited by the AR coating deposited on the output facets of the devices and by the residual reflectivity of the Bragg section. In that case and according to equation 1b the gain level for which lasing oscillation occurs is high, higher than the maximum available gain into the device. This is illustrated in FIG. 8 by a threshold gain level ($g_{th}(0)$) higher than the optical gain of the device. When a current is injected into the Bragg section, the Bragg reflectivity increases with the index modulation contrast. As a result, and according to FIG. 8, the gain threshold condition decreases and makes it possible to get the equality condition for equation 1b. In FIG. 8, this is reported for two different Bragg currents condition ($i_{b1}$ and $i_{b2}$, with $i_{b2} > i_{b1}$), corresponding to two different threshold current in the amplifying section ($i_1$ and $i_2$). For a wavelength different than the Bragg wavelength the gain is then clamped to $g(\lambda, i_1)$ and $g(\lambda, i_2)$ with $g(\lambda, i_1) - g(\lambda, i_2) = \Delta g(\lambda) \sim g_{th}(i_{b1}) - g_{th}(i_{b2})$.

Figure 9:
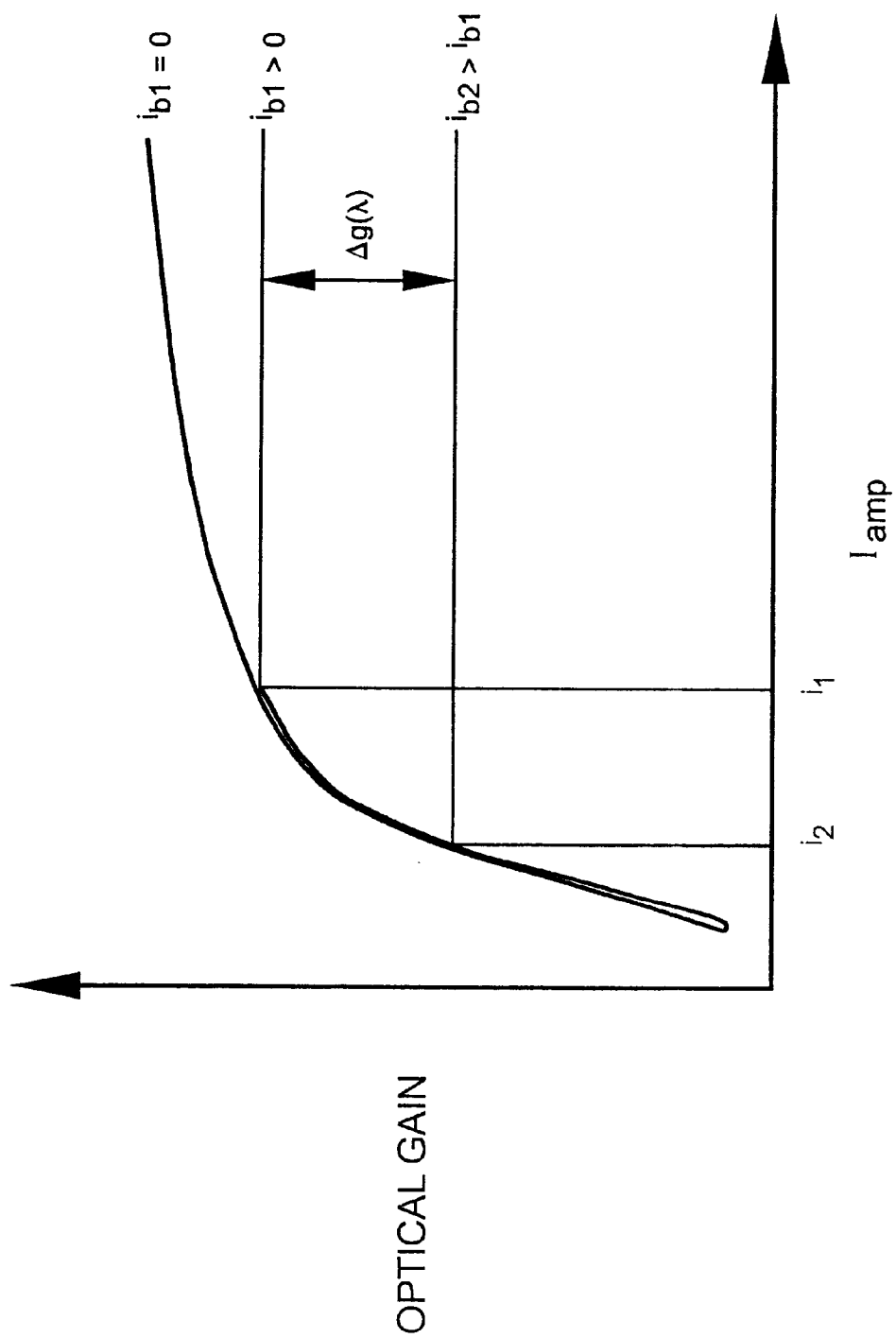
FIG. 9 is a similar chart of FIG. 7 modified by effects of the first embodiment of that invention of FIG. 4, in accordance with the present invention.

Then, for the first embodiment of FIG. 4, for a wavelength different than the Bragg wavelength, the gain is not clamped when the tuning current is zero and clamped at two different levels depending on the value of the tuning current as seen in FIG. 9.

In accordance with the first embodiment of FIG. 4, the wavelength tunability of the virtual grating results. The tunability, which depends on the optical confinement of the light into the Bragg section and on the refractive index variation with respect to the injected current can be limited if only the virtual Bragg grating effect is desired, but can also be combined to this effect to enlarge to tunability of the CG-SOA.

In summary, the use of the DBR laser principle (tunability) is combined with the use of the Clamped Gain SOA principle, in order to achieve an inventive optical device: A tunable CG-SOA with an adjustable gain level. The inventive method combines lasing tunability with a lasing threshold variation.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A gain-tunable semiconductor optical amplifier comprising:

an amplifying section for amplifying an optical signal, wherein the amplifying section comprises an amplifying medium in a light guiding semiconductor layer for providing an amplified spontaneous emission (ASE) of the amplifying section, a 3 dB optical bandwidth of the amplified spontaneous emission (ASE) of the amplifying section, and a gain clampable at a clamping wavelength outside the 3 dB optical bandwidth of the ASE of the amplifying section;

a first tunable reflector section; and a second tunable reflector section, wherein the first and second tunable reflector sections are integrated on opposed sides of the amplifying section.

2. The gain-tunable semiconductor optical amplifier of claim 1, wherein the first and second tunable reflector sections comprise a pair of distributed Bragg reflectors for providing the opposed ends of a cavity to partially reflect a radiation emitted by the amplifying medium by stimulated emission, wherein the first and second distributed Bragg reflectors having a low reflectivity such that the amplifying section is brought to stimulated emission conditions by being biased by an amplifying current and the gain of the amplifying section is clamped at the high internal gain clamping level tuned by a tuning current injected into the first and second tunable reflector sections to cause the amplifying section to emit the radiation at a clamping wavelength outside the 3 dB optical bandwidth of the amplified spontaneous emission (ASE) of the amplifying section, wherein the radiation is the amplified spontaneous emission below the gain clamping level and is the clamped amplified spontaneous emission and the stimulated emission at the clamping wavelength above the gain clamping level.

3. The gain-tunable semiconductor optical amplifier of claim 2 further comprising an anti-reflection (AR) coating applied to the terminal facets of the pair of distributed Bragg reflectors for avoiding Fabry-Perot disturbances.

4. The gain-tunable semiconductor optical amplifier of claim 3 wherein each one of the pair of distributed Bragg reflectors comprises:

a first light confinement semiconductor layer;

a second light confinement semiconductor layer, wherein the first and second light confinement semiconductor layers have opposite doping types and thus form a p-n junction;

a light guiding semiconductor layer sandwiched between the first and second light confinement semiconductor layers;

a thin plurality of stripes disposed, within one of the first and second light confinement semiconductor layers, a gap distance away from the light guiding semiconductor layer, wherein the confinement layer and the plurality of stripes form a thin periodic layer having a periodic arrangement of a series of stripes sections and confinement sections disposed within the series of stripes; and at least one electrode disposed on top of the first light confinement layer for forming the distributed Bragg reflector, such that the distributed Bragg reflector has a given optical mode able to cooperate with the thin periodic layer, in order to produce an optical feedback into the amplifying section at the clamping wavelength proportional to the physical period of the periodic layer and to the effective optical index of the distributed Bragg reflector.

5. The gain-tunable semiconductor optical amplifier of claim 4, wherein the plurality of stripes have an optical index different than the optical index of the confinement layer the stripes are disposed within, for providing the periodic arrangement made of the stripes sections and the confinement sections with different optical indexes to form a Bragg grating layer with a given Bragg grating period as the physical period and the different optical indexes for modifying the effective optical index.

6. The gain-tunable semiconductor optical amplifier of claim 5, wherein the at least one electrode allows the tuning current to be injected into the p-n junction for varying the effective optical index of the distributed Bragg reflector, in response to the tuning current, such that the tuning current is able to modify the clamping wavelength and the gain clamping level, in accordance with the wavelength dependence of the amplified spontaneous emission (ASE) of the amplifying section in a window outside the 3 dB optical bandwidth of the amplifying section, due to the pair of distributed Bragg reflectors having the given optical mode able to cooperate with the Bragg grating layer, in order to produce the optical feedback into the amplifying section at the clamping wavelength proportional to the given Bragg grating period and to the effective optical index of the distributed Bragg reflector.

7. The gain-tunable semiconductor optical amplifier of claim 5, wherein the periodic arrangement comprises a first material within the confinement layer and the plurality of stripes comprises a second material, different than the first material, for providing the Bragg grating layer.

8. The gain-tunable semiconductor optical amplifier of claim 4, wherein the plurality of stripes have a blocking doping and an optical index almost the same as the optical index of the confinement layer the stripes are disposed within, wherein the confinement layer has a non-blocking doping for providing the periodic arrangement made of the stripes sections having blocking-doping and the confinement sections having non-blocking doping to form the periodic arrangement able to spatially modulate the distribution of the charge carriers or the electric field in the light guiding semiconductor layer contained in the distributed Bragg reflector, in response to an electrical activation, when an electric current is injected into the p-n junction part relative to the distributed Bragg reflector or the p-n junction is reverse biased, so as to create, in the distributed Bragg reflector, a diffraction grating whose pitch spacing is equal to the period of the periodic arrangement, wherein the impact of the diffraction grating on the optical signal depends on the injected current into the p-n junction, so that the optical feedback into the amplifying section and the gain clamping level depends on the injected current into the p-n junction of the distributed Bragg reflector.

9. The gain-tunable semiconductor optical amplifier of claim 8, wherein the periodic arrangement comprises the same material within the confinement layer and the plurality of stripes for providing a sequence of semiconductor doping zones, alternatively of type-P and type-N, as the periodic arrangement.

10. The gain-tunable semiconductor optical amplifier of claim 8, wherein the periodic arrangement comprises the same material within the confinement layer and the plurality of stripes for providing a sequence of undoped semiconductor zones or semi-insulating zones, alternating with semiconductor zones having a doping type identical to that of the confinement semiconductor layer in which the periodic arrangement is located.

11. The gain-tunable semiconductor optical amplifier of claim 1, wherein the amplifying medium provides the amplified spontaneous emission (ASE) above the 3 dB optical bandwidth.

12. The gain-tunable semiconductor optical amplifier of claim 1, wherein the amplifying medium provides the amplified spontaneous emission (ASE) below the 3 dB optical bandwidth.

13. The gain-tunable semiconductor optical amplifier of claim 4 wherein each one of the pair of distributed Bragg reflectors comprises a Bragg grating P-I-N junction, wherein the first light confinement semiconductor layer is doped p (P), the light guiding semiconductor layer below the first confinement layer is intrinsic (I), and the second light confinement layer below the guiding layer is n-doped (N).

14. A semiconductor optical amplifier comprising:
a DBR laser body having a first terminal facet and a second terminal facet for lasing at an internal gain level; wherein the DBR laser body comprises:
a semiconductor substrate;
a bottom light confinement semiconductor layer deposited on top of the semiconductor substrate;
a light guiding semiconductor layer having an active part constituting a light amplifying medium and defining an active part of the amplifier, and a first and second passive part optically coupled to opposed ends of the active part of the guiding layer and defining a first and second passive part of the amplifier, the light guiding semiconductor layer deposited on top of the bottom light confinement layer, and the light amplifying medium producing light in response to an amplifying current biased into the amplifying part, the amplifying medium having a first band gap wavelength for producing a lasing wavelength and the passive part having a second band gap wavelength less than the first band gap wavelength;
a top light confinement semiconductor layer deposited on top of the light guiding layer, wherein the top and bottom light confinement semiconductor layers have opposite doping types and thus form a p-n junction, the top light confinement semiconductor layer having a pair of semiconductor tuning portions deposited on top of the first and second passive parts of the guiding layer and each tuning portion having a refractive index that varies in response to an electrical tuning actuation applied to each of the pair of tuning portions and tuning the lasing wavelength produced by the amplifying medium to a clamped wavelength in response to the refractive index controlled by the electrical tuning actuation;
a plurality of stripes disposed within each of the pair of tuning portions a gap distance above the light guiding layer, thereby providing a periodic diffraction grating in a waveguide length direction of the amplifier for providing gain-clamping by partially reflecting a stimulated emission of the amplifying part at the clamped wavelength;
a pair of tuning electrodes in electrical contact with the pair of tuning portions for applying the electrical tuning actuation to the plurality of stripes for coupling of the diffraction grating for the semiconductor optical amplifier, wherein the variation in electrical tuning actuation controlling an internal gain clamping level of the stimulated emission;
a bias electrode in electrical contact with the top confinement layer for biasing the amplifying current into the active part of the light guiding semiconductor layer to cause the amplifying part to emit the radiation at the clamped wavelength outside the 3 dB optical bandwidth of an amplified spontaneous emission of the amplifying part, wherein the radiation is the amplified spontaneous emission below the gain clamping level and is the clamped amplified spontaneous emission and the stimulated emission above the clamping wavelength above the gain clamping level;
a ground electrode in electrical contact with the substrate, the ground electrode commonly used with the bias and tuning pair of electrodes; and
the first and second terminal facets located at opposite ends of the light guiding and confinement layers and having the same low reflectivity of each other;
a first anti-reflection coating applied to the first terminal facet; and
a second anti-reflection coating applied to the second terminal, the first and second coatings applied for elevating the internal gain level by reducing reflection such that lasing occurs at a higher internal gain-clamping level.

15. The semiconductor optical amplifier of claim 14, wherein the electrical tuning actuation comprises an electric field for providing a variable field density.

16. The semiconductor optical amplifier of claim 15, wherein the electrical tuning actuation comprises an electric field for providing a variable field density.

17. The semiconductor optical amplifier of claim 15, wherein the electrical tuning actuation comprises an injected current for providing a variable current density.

18. A gain-tunable semiconductor optical amplifier comprising:
a CG-SOA having an amplifying section, a first passive DBR section, and a second passive DBR section on opposed sides of the amplifying section for clamping an internal gain at a gain clamping level;
a first p-doped confinement layer extender disposed on top of the first passive DBR section, the first p-doped confinement layer extender having a first electrode for applying an electrical actuation into the first passive DBR section; and
a second p-doped confinement layer extender disposed on top of the second passive DBR section, the second p-doped confinement layer extender having a second electrode for applying the electrical actuation into the second passive DBR section, the first and second confinement layer extenders adjusting the clamping level of the internal gain in response to the electrical actuation at a clamping wavelength outside the 3 dB optical bandwidth of the ASE of the amplifying section.

* * * * *